United States Patent
McGinn

(10) Patent No.: US 8,120,383 B2
(45) Date of Patent: Feb. 21, 2012

(54) VOLTAGE LEVEL TRANSLATION

(75) Inventor: John McGinn, Belleville (CA)

(73) Assignee: Avaya Inc., Basking Ridge, NJ (US)

( * ) Notice: Subject to any disclaimer, the term of this patent is extended or adjusted under 35 U.S.C. 154(b) by 323 days.

(21) Appl. No.: 11/936,458

(22) Filed: Nov. 7, 2007

(65) Prior Publication Data

US 2009/0115455 A1   May 7, 2009

(51) Int. Cl.
*H03K 19/0175* (2006.01)

(52) U.S. Cl. .............................. 326/80; 326/63; 327/333

(58) Field of Classification Search ............. 326/80–81, 326/62–63; 327/333
See application file for complete search history.

(56) References Cited

U.S. PATENT DOCUMENTS

| | | | | |
|---|---|---|---|---|
| 5,589,790 A * | 12/1996 | Allen | ............................. | 327/333 |
| 6,636,071 B1 * | 10/2003 | Yatabe | ............................. | 326/80 |
| 6,856,169 B2 * | 2/2005 | Frans et al. | ..................... | 326/82 |
| 7,471,105 B2 * | 12/2008 | Kim | ................................ | 326/68 |
| 7,948,270 B1 * | 5/2011 | Evans et al. | ..................... | 326/82 |
| 7,952,335 B2 * | 5/2011 | Gerritsen | ....................... | 323/282 |
| 2008/0100342 A1 * | 5/2008 | Muhlbacher et al. | ........... | 326/81 |
| 2008/0309395 A1 * | 12/2008 | Kaneko et al. | ................ | 327/333 |

* cited by examiner

*Primary Examiner* — Jason M Crawford
(74) *Attorney, Agent, or Firm* — Barnes & Thornburg LLP

(57) ABSTRACT

A virtual zero delay unidirectional high voltage logic to low voltage CMOS logic voltage level translator can be achieved using a capacitive voltage divider coupled with the standard protection diodes commonly incorporated in low side logic (e.g. Xilinx Spartan-3E FPGA's). The complete voltage level translator will work equally well on frequencies from DC up to the rated operational frequency of the driver and receiver. Load side parasitic CMOS input capacitance in this case is ironically an asset rather than a liability since it can be used effectively as one element of the capacitive voltage divider. High voltage logic (e.g. 0 to 5V) can thus interface to lower voltage CMOS logic (e.g. 2.5V or 3.3V) with a minimum of additional external components and with virtually zero time delay.

18 Claims, 8 Drawing Sheets

VOLTAGE LEVEL TRANSLATION

FIELD OF THE INVENTION

The present invention relates to voltage level translator circuits for use in integrated circuit logic devices as well as in discrete logic implementations.

BACKGROUND

The expense, propagation time delay, reduced data transmission rate and board real estate required to use conventional voltage level translators (e.g. Texas Instruments level translating buffer SN74LVT16244) are a problem in conventional circuit designs. Conventional approaches often use a series resistor with protection diode or resistive voltage divider. Both approaches suffer from RC time delay due to the resistive element coupled with the parasitic capacitance of the receiver input. For example, see slides 69-75 of the Xilinx App note at http://www.xilinx.com/products/spartan3e/sp3e_power.pdf.

Another level translation approach is to use series FET (Field Effect Transistor) devices such as Texas Instruments SN74CBT1G384 which provides a low impedance path for low voltage inputs but increases the series impedance to a high value once the low side output voltage exceeds a defined threshold. This approach carries the drawback of some minimal propagation delay and also requires the FET transistor plus an external voltage bias circuit.

A very similar approach is to use another form of series FET circuit such as implemented in the Texas Instruments SN74TVC3306 device. This approach carries the same disadvantages as described above for the SN74CBT1G384. Yet another approach is to use overvoltage-tolerant devices on the low voltage side inputs. This requires eliminating the low voltage input protection clamp diode to its supply voltage and thus is not amenable to all designs.

An object of the present invention is to overcome or ameliorate the problems described above. More specifically, an object of the present invention is to provide a minimal delay voltage level translator for use in integrated circuit logic devices.

SUMMARY OF THE INVENTION

According to one aspect of the present invention, there is provided a voltage level translator circuit for coupling a higher voltage device or circuit to a lower voltage device or circuit, the voltage level translator circuit comprising:
  a higher voltage input for electrically coupling the voltage level translator circuit to a signal output of the higher voltage device or circuit;
  a lower voltage output for electrically coupling the voltage level translator circuit to a signal input of the lower voltage device or circuit; and
  a circuit element electrically coupled between the higher voltage input and lower voltage output;
  wherein the circuit element is arranged to provide a capacitance between the higher voltage input and lower voltage output, the capacitance having a value selected in dependence on a combination of a desired voltage division ratio between the higher voltage output and the lower voltage input and a value of an input capacitance of the lower voltage device or circuit expected to occur between the lower voltage input and a ground reference.

According to another aspect of the present invention, there is provided a circuit board comprising a voltage level translator circuit according to the above aspect of the present invention.

According to another aspect of the present invention, there is provided a lower voltage device or circuit comprising:
  one or more voltage level translator circuits, each comprising:
    a higher voltage input for electrically coupling the voltage level translator circuit to a signal output of a higher voltage device or circuit;
    a lower voltage output for electrically coupling the voltage level translator circuit to a signal input of the lower voltage device or circuit; and
    a circuit element electrically coupled between the higher voltage input and lower voltage output;
    wherein the circuit element is arranged to provide a capacitance between the higher voltage input and lower voltage output, the capacitance having a value selected in dependence on a combination of a desired voltage division ratio between the higher voltage output and the lower voltage input and a value of an input capacitance of the lower voltage device or circuit expected to occur between the lower voltage input and a ground reference.

According to another aspect of the present invention, there is provided a higher voltage device or circuit comprising:
  one or more voltage level translator circuits, each comprising:
    a higher voltage input for electrically coupling the voltage level translator circuit to a signal output of the higher voltage device or circuit;
    a lower voltage output for electrically coupling the voltage level translator circuit to a signal input of a lower voltage device or circuit; and
    a circuit element electrically coupled between the higher voltage input and lower voltage output;
    wherein the circuit element is arranged to provide a capacitance between the higher voltage input and lower voltage output, the capacitance having a value selected in dependence on a combination of a desired voltage division ratio between the higher voltage output and the lower voltage input and a value of an input capacitance of the lower voltage device or circuit expected to occur between the lower voltage input and a ground reference.

Advantageously, virtually zero delay voltage level translation is provided. Virtually zero delay is an important attribute of a voltage level translator circuit since it facilitates faster data transmission rates than would otherwise be possible.

Other advantages and aspect of the present invention will be apparent from the detailed description provided below.

There now follows, by way of example, a detailed description of the present invention in which:

DETAILED DESCRIPTION OF THE INVENTION

Figure 1:
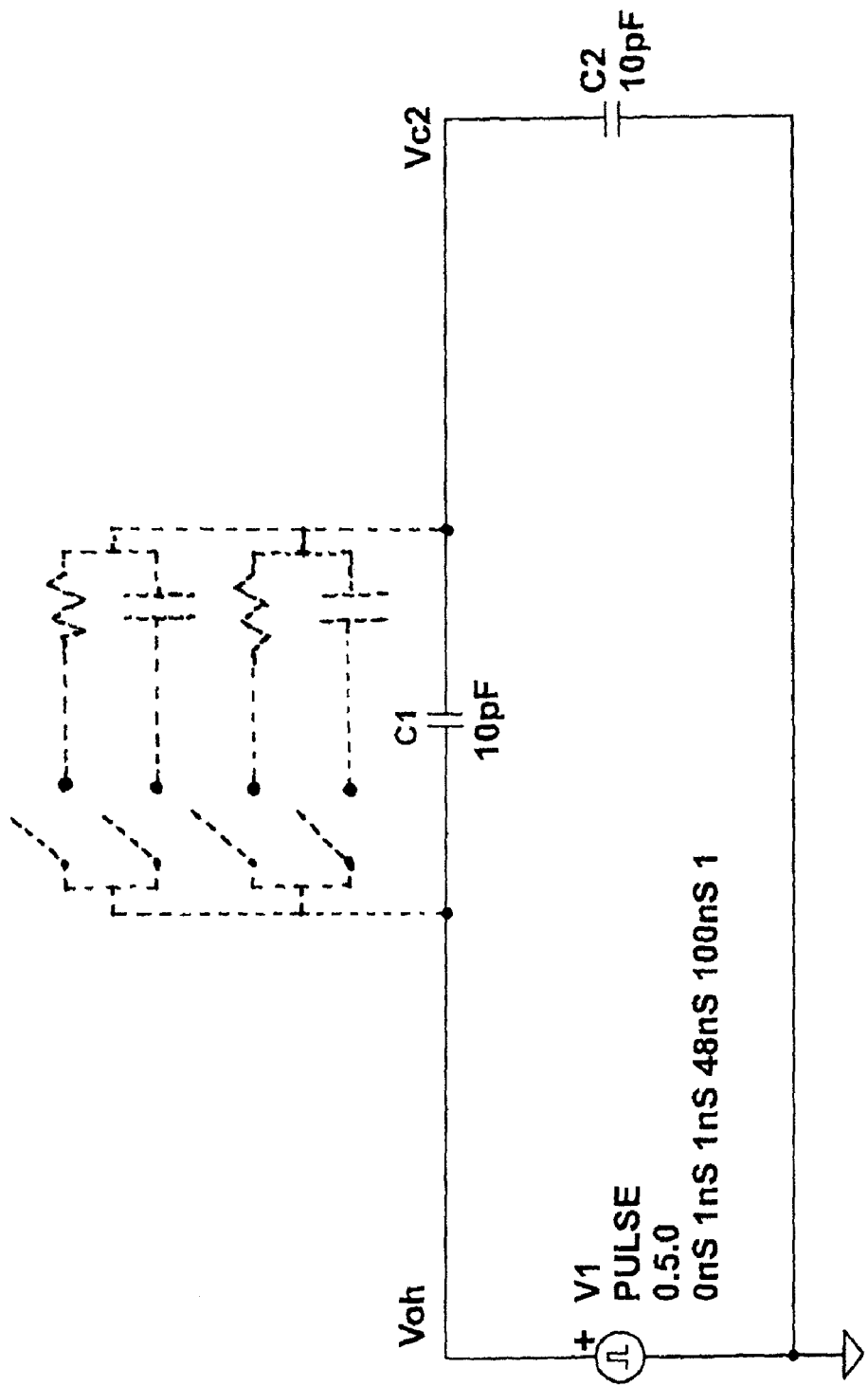
FIG. 1 shows a basic series capacitor network according to the present invention.

A virtually zero delay unidirectional high voltage logic to low voltage CMOS logic voltage level translator can be achieved using a capacitive voltage divider coupled with the standard protection diodes commonly incorporated in low side logic (e.g. Xilinx Spartan-3E FPGA's). The complete voltage level translator will work equally well on frequencies from DC up to the rated operational frequency of the driver and receiver. Load side parasitic CMOS input capacitance in this case is ironically an asset rather than a liability since it can be used effectively as one element of the capacitive voltage divider. High voltage logic (e.g. 0 to 5V) can thus interface to lower voltage CMOS logic (e.g. 2.5V or 3.3V) with a minimum of additional external components and with zero time delay. Voltage level translation is accomplished by matching the low voltage load side parasitic input capacitance with an appropriately sized series capacitor connected from the high voltage driver output to the low voltage CMOS receiver input. For example, consider the following simple circuit:

FIG. 1 shows a basic series capacitor circuit. For this simple linear circuit where C1 and C2 form a voltage divider, assuming ideal components and ignoring for the moment initial conditions, we can deduce that the output voltage ($V_{C2}$) is expressed by the following frequency independent relation:

$$V_{C2} = \frac{V_{OH}}{Z_{C1} + Z_{C2}} * Z_{C2} = V_{OH} * \frac{C_1}{C_1 + C_2} \quad \text{EQUATION 1}$$

From a time domain perspective, we can equally say that when the high voltage output transitions high, an identical current flows through C1 and C2.

The charge imparted to a capacitor is given by:

$$Q_C = \int I_C(t) \delta t$$

And since $I_{C1}(t) = I_{C2}(t)$ it follows that at all times (ignoring leakage and initial conditions):

$$Q_{C1} = Q_{C2}$$

The voltage on a capacitor is given by:

$$V_C = \frac{Q_C}{C}$$

Thus for this circuit it is evident that:

$$V_{OH} = V_{C1} + V_{C2} = \frac{Q_{C1}}{C_1} + \frac{Q_{C2}}{C_2} = Q_C * \frac{(C_1 + C_2)}{C_1 C_2}$$

Therefore $$Q_C = V_{OH} * \frac{C_1 C_2}{(C_1 + C_2)}$$

Therefore, again we arrive at:

$$V_{C2} = V_{OH} * \frac{C_1}{(C_1 + C_2)}$$

To a first approximation, this circuit would be a rough but admittedly oversimplified representation of the case that a 5V CMOS device is driving a 2.5V CMOS device through a series capacitor. Assuming 10 pF parasitic load capacitance (C2), a series capacitor C1 of 10 pF would then be optimal to reduce $V_{OH}$ to $V_{IHmax}$ on the low voltage CMOS input (N.B. assuming $V_{OH}$ is equal to $V_{CC5}$=5V. In the more realistic case that $V_{OH} < V_{CC5}$, a larger value of C1 would be required). When the output driver transitions from 0V to say 5V, the voltage impressed on the low voltage receiver input is virtually instantly reduced in the ratio of $V_{OH} * C1/(C1+C2)$ where C2 is the parasitic load input capacitance and C1 is the capacitor connected in series between the high voltage driver and CMOS load.

Rearranging the terms of Equation 1 we can express a formula for the value of C1 in terms of the independent variables C2, $V_{OH}$ and $V_{C2}$.

$$C1 = \frac{C_2 \cdot V_{C2}}{(V_{OH} \cdot V_{C2})} \quad \text{EQUATION 2}$$

When the high voltage driver output transitions to the low state, the load voltage of both C1 and C2 are both as quickly discharged as they are charged in the rising transition case. In this simple example, when the driving source falls to $V_{OL}$, the discharge current and charge will again be equal for the two capacitors, resulting in the same voltage division ratio as in the charging case with the result that the receiver input will see only a fraction of $V_{OL}$, all else being equal.

For different voltage ratios, the capacitor ratios are suitably chosen from the relation of Equation 2 above such that the charge/discharge current will charge/discharge the series and parasitic capacitors in the appropriate voltage division ratio. A further advantage of this capacitive voltage divider circuit is the fact that since C1 and C2 are in series, the load capacitance that the high side driver sees is reduced to less than that of the receiver input capacitance alone.

Figure 2:
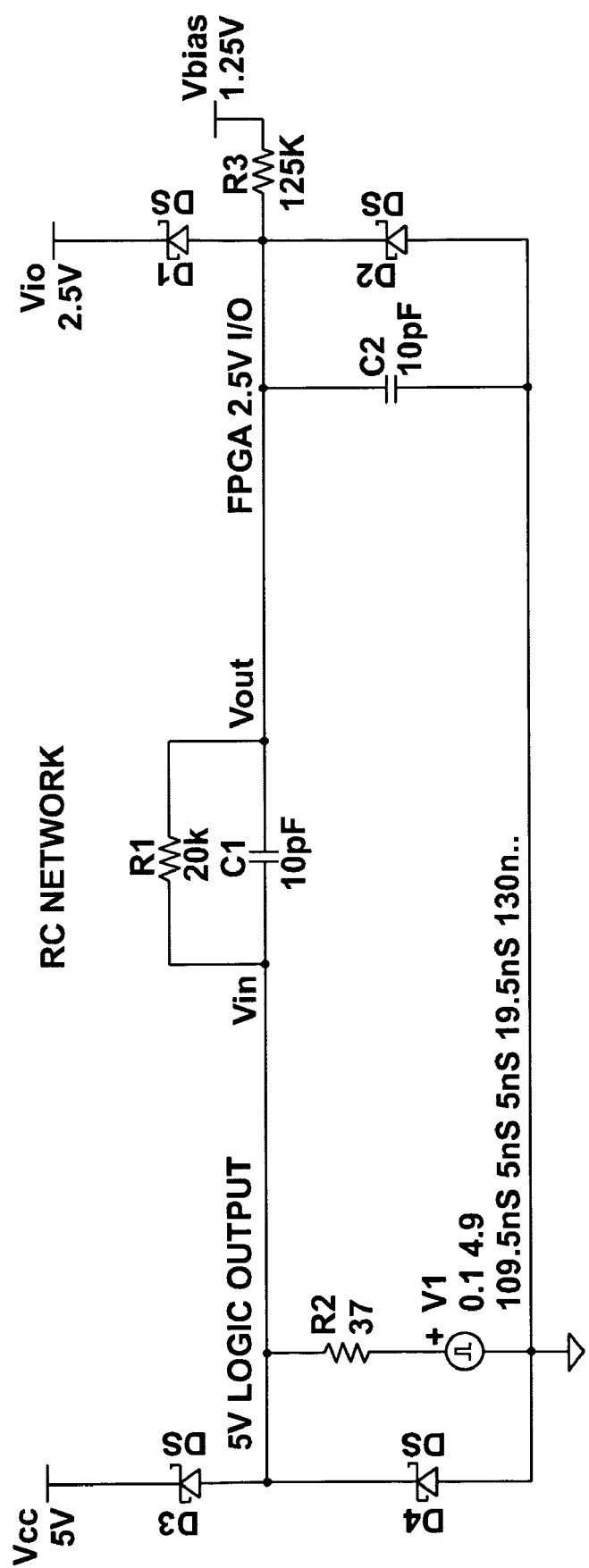
FIG. 2 shows a series capacitance network with protection diodes and DC biasing according to the present invention.

FIG. 2 shows a more realistic circuit with protection diodes. In this case the receiver input protection diodes D1 and D2 become forward biased and shunt away excess current from C1 whenever the voltage on C2 goes outside of the supply rails by more than one diode drop. When within rated protection diode current limits, this clamping action establishes the upper and lower bounds of the receiver DC input voltage. If the parasitic load capacitor C2 value is not known precisely or varies from lot to lot but an upper bound for it can be established, an appropriate nominal value for C1 can still be successfully determined by the relation of Equation 1. Similarly, C1 must be selected taking into account component tolerance and the expected minimum $V_{OH}$ which will be a function of $V_{CC}$ regulation and high side driver characteristics. Note that IBIS models for the driver may be a valuable resource for a more accurate determination of $V_{OH}$ and thus the optimum value for C1. The IBIS model can also confirm that driver current will not exceed protection diode current limits. Now if C2 is smaller than its maximum value, or if $V_{OH}$ is higher than its minimum, or if C1 is at the high end of its tolerance, excess charge than required to fully charge C2 to the low side $V_{CC}$ will be shunted to the low side $V_{CC}$ supply (2.5V) via the load input protection diode D1 until C1 is charged from $V_{OH}*C1/(C1+C2)$ finally to $V_{OH}-(V_{CC}2.5+V_{D1})$. This current will be transient and can be controlled to within allowable protection diode transient current limits by virtue of the drive impedance of the high voltage output (e.g. typically 2 to 12 mA for many devices).

Once in the high steady state, the driver output could approach $V_{CC}5$ and the only steady state current required is to overcome the worst case load side input leakage current of perhaps 10 uA through R3 (e.g. typical for a Xilinx FPGA input), so a resistor of approximately 20K ohms in parallel with C1 (R1) would easily suffice. Continuous DC protection diode current in the high state is then just 125 uA which devices like Xilinx Spartan-3E can easily accommodate. No RC time constant is involved which would otherwise cause signal delay and neither is there any significant signal voltage drop because of this resistor since the only current which flows through it is the DC leakage current of the CMOS receiver input.

In the falling signal case when a capacitor value mismatch exists (e.g. C2 is smaller than its maximum) excess current will be drawn up from GND through the lower protection diode D2 until C1 is fully discharged in direct analogy with the charging case so that the low side receiver input will see the voltage drop across the low side protection diode of $-V_{D2}$. Once the low steady state is reached, the low state driver must still overcome up to 10 uA of DC input leakage current through R3 in this example, again which the 20K resistor easily facilitates. The VIL voltage the receiver will see in the steady state after the capacitive transient is $V_{OL}+(20K*10$ uA), or $V_{OL}+200$ mV, which should satisfy maximum VIL requirements for most devices with sufficient noise margin.

Note that although a value of 20K for resistor R1 would suffice in this example from a DC bias current consideration, such a high impedance will make the receiver input signal susceptible to crosstalk from adjacent "aggressor" signals at intermediate frequencies where C1 impedance is also high. In practice, R1 should be made as small as possible without exceeding protection diode current ratings.

Figure 3:
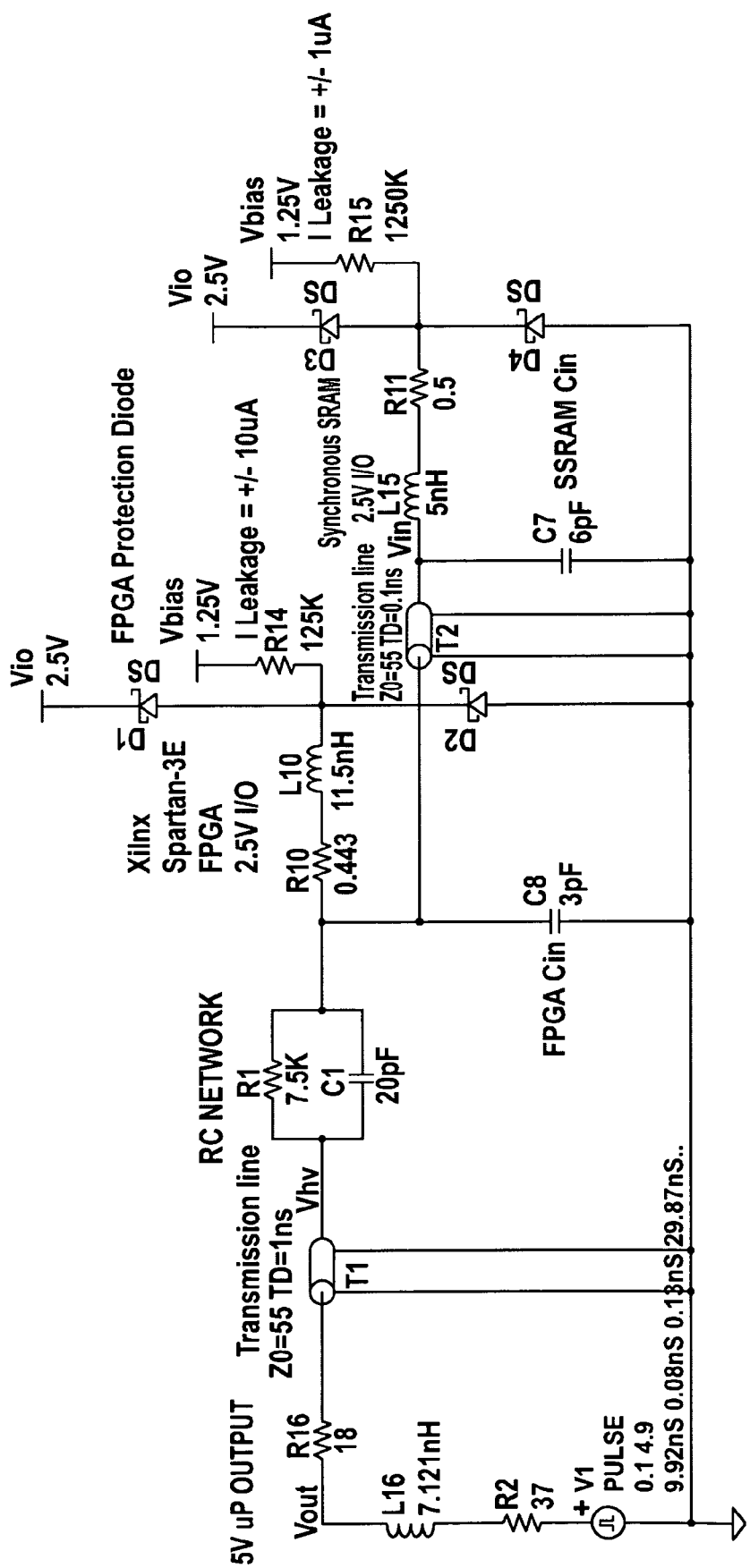
FIG. 3 shows a voltage level translation circuit with realistic device models according to the present invention.
Figure 4:
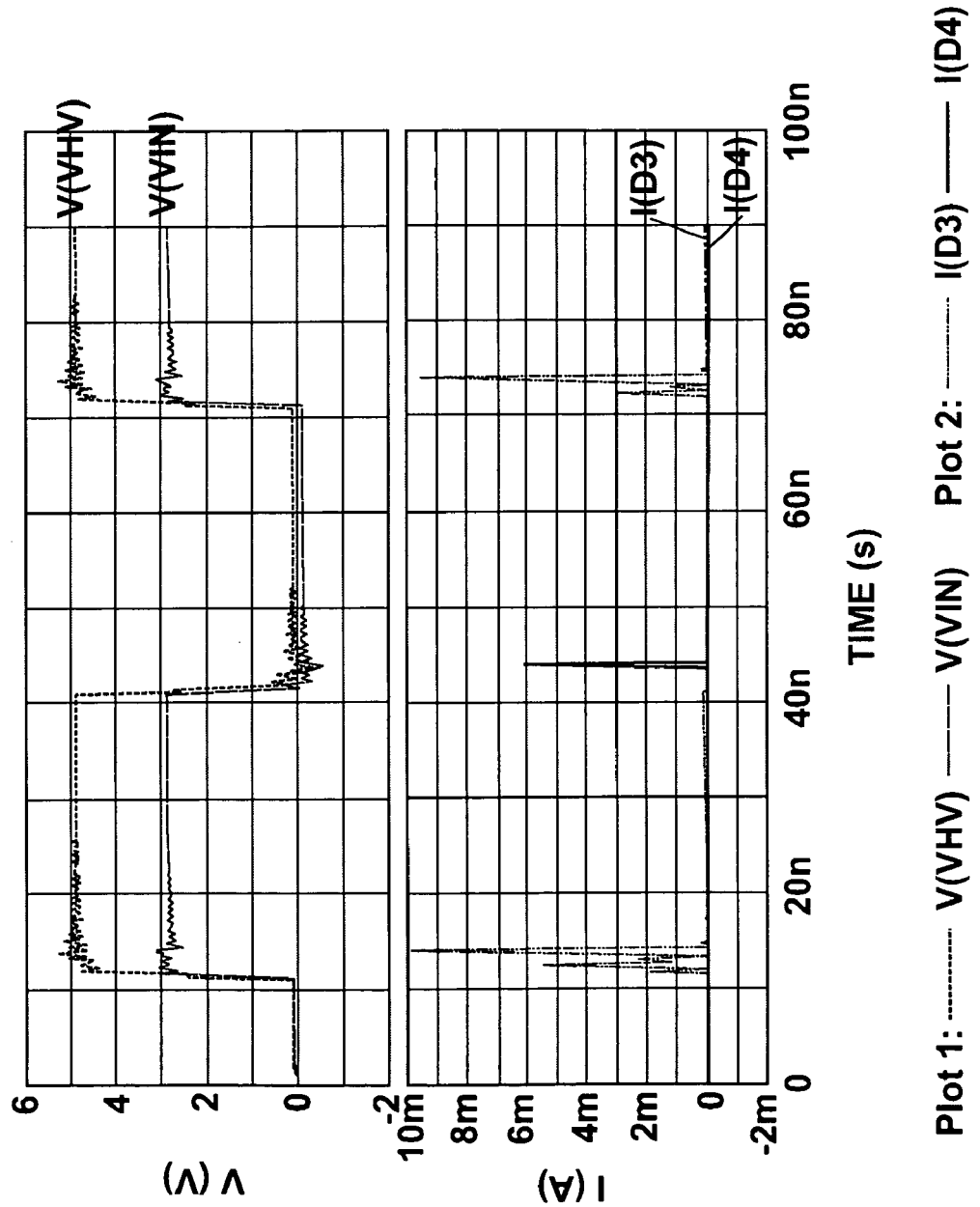
FIGS. 4 and 5 are screenshots of a TopSPICE (Penzar Corporation analog simulator) simulation of the circuit of FIG. 3 with selected values for C1 and C2.

FIG. 3 shows a more elaborate circuit with parasitic elements of actual devices taken from IBIS models as well as transmission lines between driver and loads. FIG. 4 is a screenshot of a TopSPICE simulation of the circuit of FIG. 3 and shows the input and output voltage and current waveforms for the circuit of FIG. 3. TOPSpice is a commercial analog simulation tool developed by PENZAR Corporation. See http://penzar.com/topspice/topspice.htm. It is a derivative of the more generic SPICE analog simulator. See http://en.wikipedia.org/wiki/SPICE. The vertical axes show either voltage (V) or current (I). The horizontal access always shows time. The graph represents the time varying waveform of voltage (or current) with respect to the time. In this way both the short term transient behaviour as well as the long term behaviour are illustrated. Note that VHV is reduced in amplitude to Vin at the receiver input and with no delay. Observe also that the output swing goes above the positive supply rail in the high state and below ground in the low state, in each case by the voltage drop of the forward biased protection diode. This results in improved noise margin.

Figure 5:
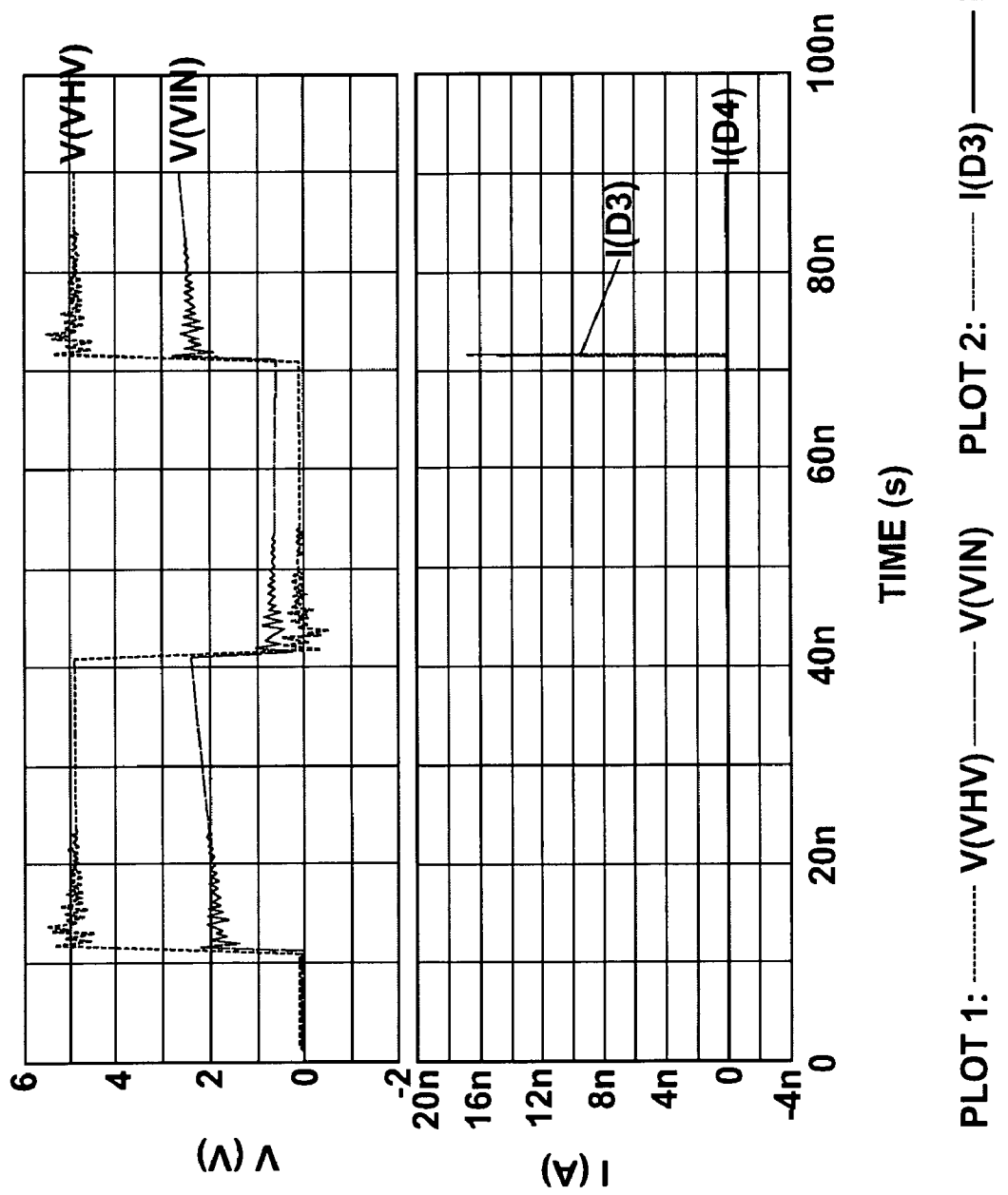

Care should be taken to ensure that the minimum value of C1 is never so small that failure to achieve diode clamping occurs. In this scenario $V_{IH}$ and $V_{IL}$ thresholds may be violated and an RC charge/discharge time constant will determine when the receiver achieves full supply rail input as shown in FIG. 5.

Figure 6:
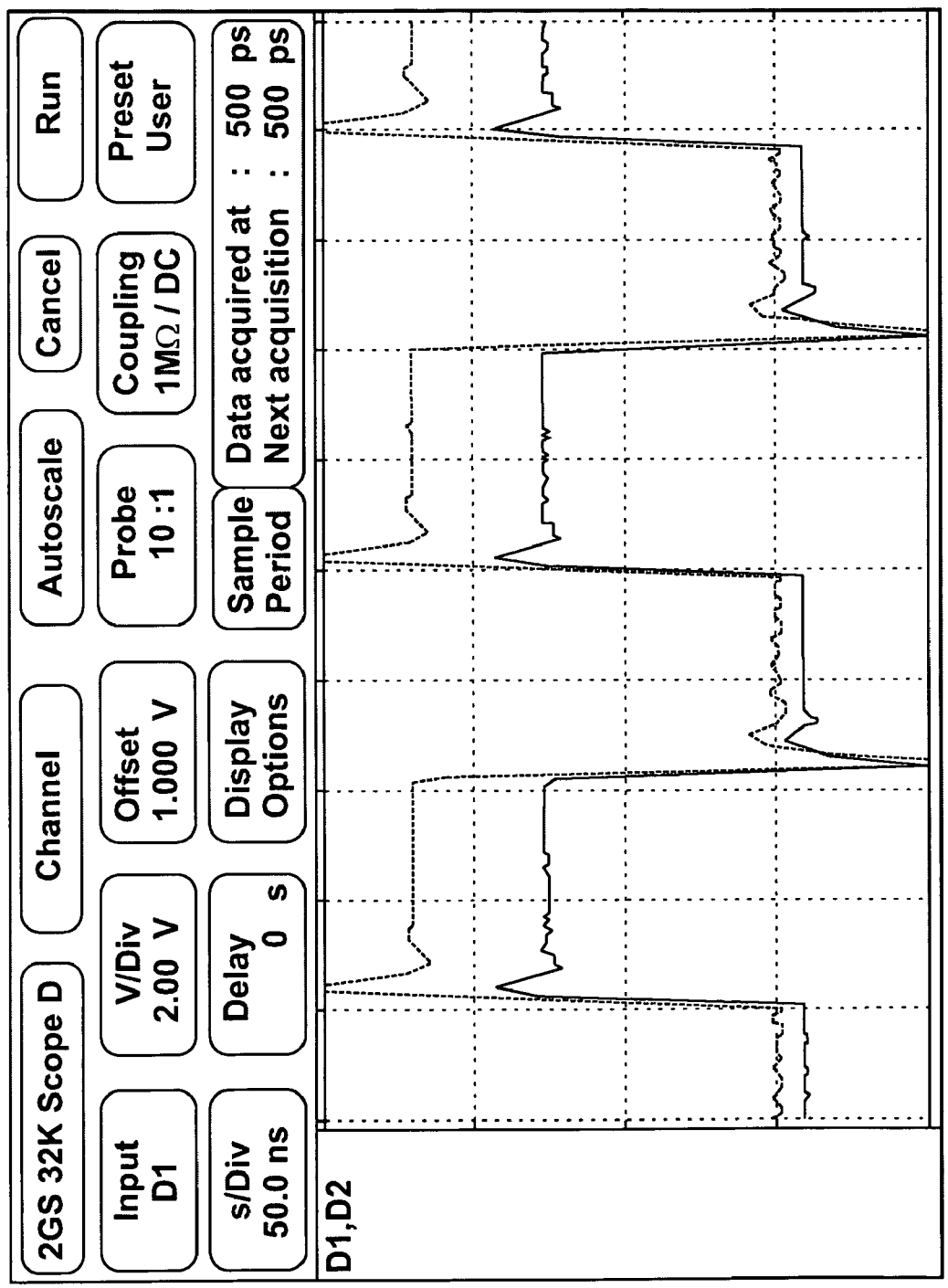
FIGS. 6 to 8 show oscilloscope measurements of $V_{HV}$ and $V_{IN}$ for a circuit the circuit of FIG. 3 with selected values for C1 and C2.
Figure 7:
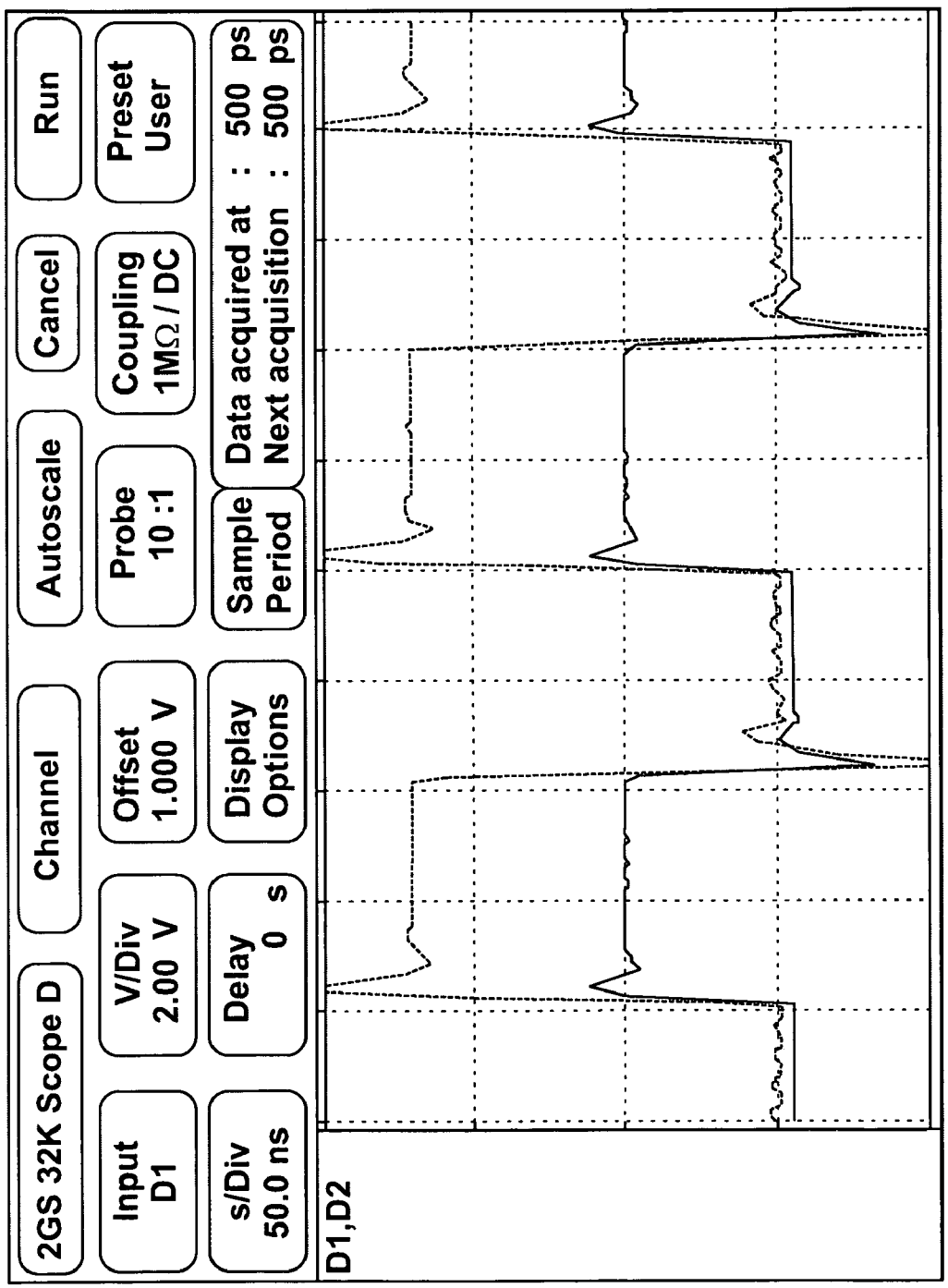
Figure 8:
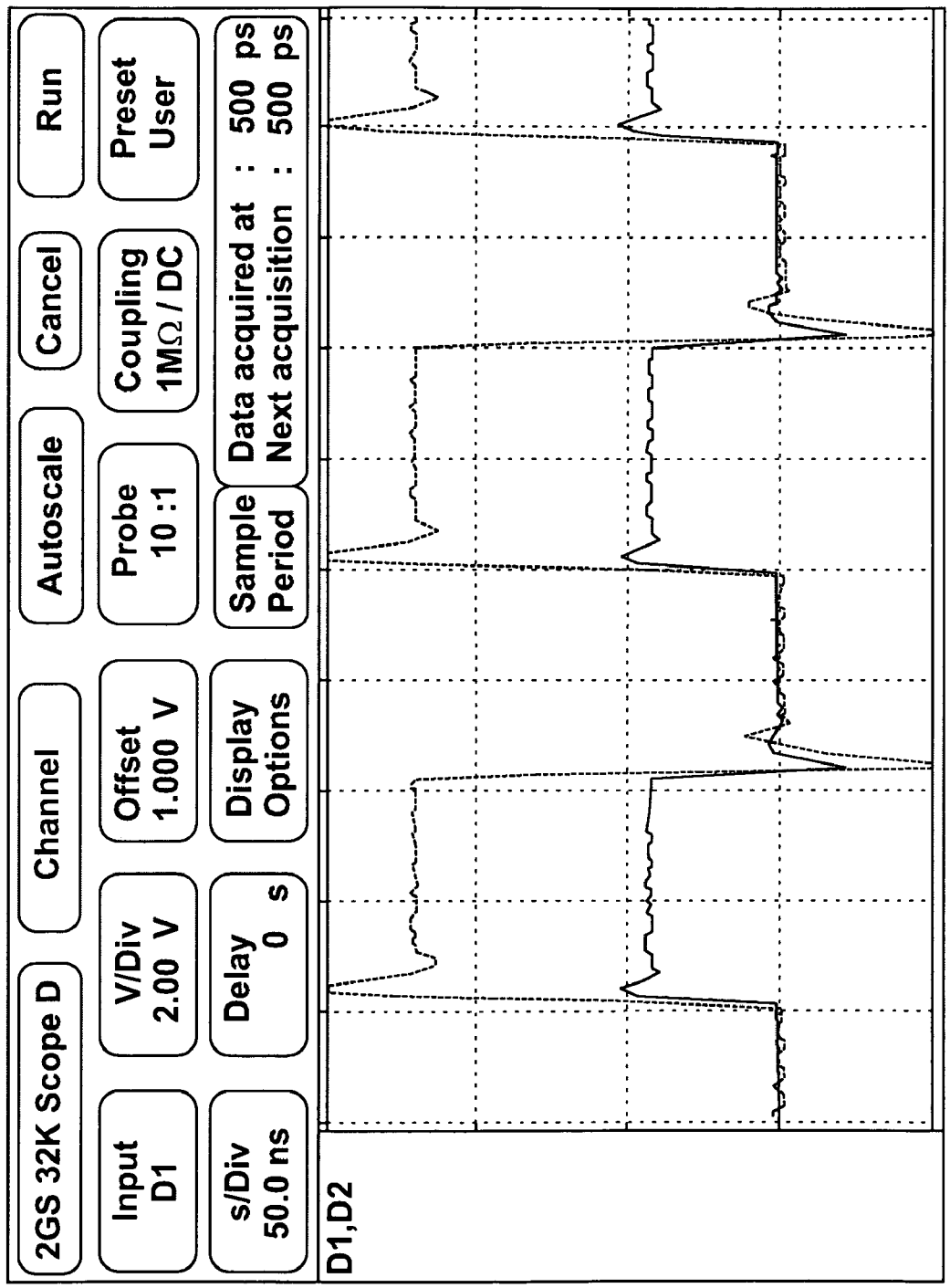

FIGS. 6 to 8 show actual oscilloscope measurements of $V_{HV}$ and $V_{IN}$ for a circuit with various C1:C2 capacitor ratios as follows: C1=33 pF, C2=12 pF, no protection diodes (FIG. 6); C1=10 pF, C2=12 pF, no protection diodes (FIG. 7); and C1=6.8 pF, C2=12 pF, no protection diodes (FIG. 8).

Signal Integrity

1. Since track to track capacitance will couple switching noise from adjacent "aggressor" tracks into "victim" tracks, care must be taken to ensure that inter-track crosstalk coupling is very low compared to signal source impedance. Crosstalk coupling can take two forms: capacitive and inductive. Both can be reduced very effectively by keeping the track pitch large relative to the track height over return plane. A track pitch to height ratio of 5:1 or greater should reduce crosstalk to negligible levels. Reducing the series resistor value will also help reduce crosstalk at the expense of increased protection diode currents.
2. End terminators must not be used with this level translator circuit since this would require an exceedingly low value of bias resistor R1.
3. Ferrite beads must not be used on high voltage source signals as this would exacerbate crosstalk coupling and signal delay.

MTTF (Mean Time To Failure)

Care must be taken to keep protection diode current below manufacturer recommended levels to prevent long term device failure due to electro-migration. ESD protection diodes are in general not rated for this type of use and are likely to fail catastrophically if used in this way due to electromigration (see Signal Consulting article at http://www.high-speeddigitaidesign.com/Pubs/edn/ProtectionForYour.htm). True overshoot limiting diodes are required to handle these large and repetitive currents. However when within rated protection diode current limits, this clamping action establishes the upper and lower bounds of the receiver DC input voltage (for example, Xilinx Spartan-3E I/O protection diodes are specified to withstand up to +/-100 mA of over/under clamp current at +/-0.5V with respect to Vcco/GND on up to 100 pins simultaneously).

In order to minimize protection diode current, C1 should be kept as low as possible to satisfy all other design constraints. If available, the IBIS model for the receiver may provide more accurate total input pin capacitance (C_comp+Cpkg) for the actual package and particular I/O standard than the more general datasheet.

Bi-directional Lines

For bi-directional voltage level translation (e.g. a CMOS µP data bus), the parallel RC network could be paralleled with a low ON resistance FET. In this way virtually the full low voltage output could be impressed on the high voltage input when the FET is enabled with virtually zero delay. For example, a 74CBT16245 bus switch could be used to allow a 16 bit 5V CMOS uP data bus read from a 2.5V I/O FPGA or memory. The bus switch could be enabled simply with a µP RD-signal. A 2.5V CMOS driver could then drive a 5V CMOS device input with a $V_{IH}$ of 2.0V with several hundred mV of noise margin. At all times other than a READ cycle, the FET bus switch would be disabled and the RC network would perform level translation from high to low voltage. After the FET turns off and the bi-directional high voltage source again starts driving, initial voltage conditions will again be established on C1 and C2 for voltage division with the help of the protection diodes.

OTHER EMBODIMENTS

1. It is possible to use a "leaky" capacitor or a highly capacitive resistor in order to combine the R and C devices into a single element for critical PCB real estate applications. This could take the form of a reverse biased diode or junction transistor or a weakly enabled FET.

2. Capacitor C1 and resistor R1 (or an equivalent to these in the form of a reverse biased diode or junction transistor or extremely weakly enabled FET) could be fabricated within the integrated circuit of either the high voltage driver or the low voltage receiver in order to allow the user to configure the device for either standard or level translated mode of operation. Fabricating the series capacitor within the low voltage device would carry the advantage that capacitance value changes due to process variation or temperature would track with that of the input capacitance such that the value ratio and thus voltage division ratio would remain constant.

3. Selection for standard mode or voltage division mode could be achieved with a programmable logic controlled FET switch in parallel with the R1∥C1 network to enable/disable level translation.

4. Several different capacitor values could be implemented and selected by programmable logic in order to support multiple voltage divider ratios (e.g. 5V to 2.5V, 3.3V to 2.5V or 3.3V to 1.2V).

5. Selection of resistor value could be achieved similarly to the above method and independently of the capacitor but this would be unlikely to be necessary if implemented in the low voltage device since leakage current would be only slightly dependent on the chosen voltage division ratio.

The invention claimed is:

1. A voltage level translator circuit for coupling a higher voltage circuit to a lower voltage load circuit, the voltage level translator circuit comprising:
   a higher voltage input for electrically coupling the voltage level translator circuit to a signal output of the higher voltage circuit;
   a lower voltage output for electrically coupling the voltage level translator circuit to a signal input of the lower voltage circuit; and
   a circuit element electrically coupled between the higher voltage input and lower voltage output;
   wherein the circuit element is arranged to provide a capacitance between the higher voltage input and lower voltage output, the capacitance having a value selected in dependence on a combination of (i) a desired voltage division ratio between the higher voltage input and the lower voltage output and (ii) a value of an input load capacitance of the lower voltage load circuit expected to occur between the lower voltage output and a ground reference.

2. A voltage level translator circuit according to claim 1, wherein the input load capacitance value is a stated upper bound of the input load capacitance of the lower voltage load circuit expected to occur between the lower voltage output and a ground reference.

3. A voltage level translator circuit according claim 1, wherein the capacitance value of the circuit element is selected to be the input capacitance value multiplied by the desired voltage of the lower voltage output in a logic high state divided by the difference in voltage between the output voltage of the higher voltage device or circuit in a logic high state and the desired voltage of the lower voltage output in a logic high state.

4. A voltage level translator circuit according to claim 3, wherein the output voltage of the higher voltage circuit in a logic high state is a stated lower bound for output voltage of the higher voltage circuit in a logic high state.

5. A voltage level translator circuit according to claim 1, wherein the circuit element provides a resistance between the higher voltage input and lower voltage output, the resistance having a value selected such that a DC current flowing from the higher voltage circuit to the lower voltage load circuit will overcome an effective DC leakage current of the lower voltage load circuit.

6. A voltage level translator circuit according to claim 5, wherein the resistance value is substantially less than the high voltage input voltage minus the low voltage output voltage all divided by the effective DC leakage current of the lower load circuit.

7. A voltage level translator circuit according to claim 5, wherein the effective DC leakage current is a stated upper bound for the effective DC leakage current of the lower voltage load circuit.

8. A voltage level translator circuit according to claim 1, wherein the circuit element provides a resistance between the higher voltage input and lower voltage output, the resistance having a value selected such that a stated upper bound for DC current flowing through a protection diode of the input of the lower voltage load circuit is not exceeded.

9. A voltage level translator circuit according to claim 8, wherein the resistance value is at least as great as the higher voltage input voltage minus the lower voltage output voltage all divided by a maximum allowed input protection diode DC current.

10. A voltage level translator circuit according to claim 1, wherein the circuit element comprises a plurality of capacitative sub elements each being selectably electrically coupleable between the higher voltage input and lower voltage output to provide a capacitance there between, and
    wherein the voltage level translator circuit comprises one or more switches arranged to selectively electrically couple one or more of the capacitative sub elements between the higher voltage input and lower voltage output, thereby to provide a capacitance having a plurality of selectable values.

11. A voltage level translator circuit according to claim 10, wherein the one or more switches each comprise a field effect transistor.

12. A voltage level translator circuit according to claim 10, wherein each capacitative sub element is one selected from the group comprising: a capacitor; a reverse-biased diode; a weakly-enabled field effect transistor; and a reverse-biased bipolar transistor.

13. A voltage level translator circuit according to claim 10, wherein each resistive sub element is one selected from the group comprising: a resistor; a reverse-biased diode; a weakly-enabled field effect transistor; and a reverse-biased bipolar transistor.

14. A voltage level translator circuit according to claim 1, wherein the circuit element comprises a plurality of resistive sub elements each being selectably electrically coupleable between the higher voltage input and lower voltage output to provide a resistance there between, and
    wherein the voltage level translator circuit comprises one or more switches arranged to selectively electrically couple one or more of the resistive sub elements between the higher voltage input and lower voltage output thereby to provide a resistance having a plurality of selectable values.

15. A voltage level translator circuit according to claim 1, wherein the first circuit element is one selected from the group comprising: a capacitor; a reverse-biased diode; a weakly-enabled field effect transistor; and a reverse-biased bipolar transistor.

16. A circuit board comprising a voltage level translator circuit according to claim 1.

17. A lower voltage load circuit comprising:
one or more voltage level translator circuits, each comprising:
a higher voltage input for electrically coupling the voltage level translator circuit to a signal output of a higher voltage circuit;
a lower voltage output for electrically coupling the voltage level translator circuit to a signal input of the lower voltage circuit; and
a circuit element electrically coupled between the higher voltage input and lower voltage output;
wherein the circuit element is arranged to provide a capacitance between the higher voltage input and lower voltage output, the capacitance having a value selected in dependence on a combination of (i) a desired voltage division ratio between the higher voltage input and the lower voltage output and (ii) a value of an input load capacitance of the lower voltage load circuit expected to occur between the lower voltage output and a ground reference.

18. A higher voltage circuit comprising:
one or more voltage level translator circuits, each comprising:
a higher voltage input for electrically coupling the voltage level translator circuit to a signal output of the higher voltage circuit;
a lower voltage output for electrically coupling the voltage level translator circuit to a signal input of a lower voltage load circuit; and
a circuit element electrically coupled between the higher voltage input and lower voltage output;
wherein the circuit element is arranged to provide a capacitance between the higher voltage input and lower voltage output, the capacitance having a value selected in dependence on a combination of (i) a desired voltage division ratio between the higher voltage input and the lower voltage load circuit expected to occur between the lower voltage output and a ground reference.

* * * * *